United States Patent

Kern

[15] 3,702,423

[45] Nov. 7, 1972

[54] LOW-FORCE PRINTED CIRCUIT MALE CONNECTION APPARATUS

[72] Inventor: Walter Kern, Cohasset, Mass.

[73] Assignee: Teradyne, Inc., Boston, Mass.

[22] Filed: Nov. 9, 1971

[21] Appl. No.: 196,903

[52] U.S. Cl.........317/101 D, 324/158 F, 339/17 LM

[51] Int. Cl...............................................H05k 1/00

[58] Field of Search..317/101 CM, 101 D, 101 F, 101 CW, 317/101 CE, 101 DH, 118; 324/158 F; 339/17 L, 17 LC, 17 LM, 17 M, 176 MP

[56] References Cited

UNITED STATES PATENTS 3,609,463 9/1971 Labowe .............317/101 DH

OTHER PUBLICATIONS

IBM Technical Disclosure Bulletin, Socket Connector, Brain, Vol. 13 No. 6, Nov. 1970, pg. 1549

*Primary Examiner*—Lewis H. Myers
*Assistant Examiner*—Gerald P. Tolin
*Attorney*—Herbert W. Kenway et al.

[57] ABSTRACT

Printed circuit apparatus has the circuit board structure which carries the edge contacts constructed with two sheet members in register with each other and having a total thickness less than standard, and with a wedge member between the sheet members and movable to separate them, after plugging them into an edge-receiving receptacle, to the thickness standard for the receptacle.

11 Claims, 5 Drawing Figures

LOW-FORCE PRINTED CIRCUIT MALE CONNECTION APPARATUS

BACKGROUND

This invention relates to printed circuit board connector apparatus. In particular, it provides a printed circuit board construction that enables a circuit board carrying edge contacts to be plugged into, and removed from, a board-edge receptacle with significantly less force and less contact wear than conventional printed circuit structures.

The invention is useful, for example, in the testing of wired printed circuit back planes and accordingly is described with particular reference thereto, although the invention is not so limited. A printed circuit back plane is an electrical, plug-in mounting and connection rack for printed circuit boards. A back plane generally has a metal or like panel apertured to mount an array of printed circuit board connectors. Each connector has a multi-contact receptacle on one side of the panel for receiving printed-circuit card-edge contacts, and has wire-wrap pins or other terminals protruding from the other side of the panel, generally with one such pin in electrical connection with each receptacle contact. Insulated wires, or printed or other conductors, connect the pins to one another, and to cables for connection to other equipment.

It often is desirable to test each back plane after the wiring of the pins in order to locate missing or defective wiring connections. However, the testing of wired printed circuit back planes typically involves plugging numerous printed circuit test boards into the receptacles of the back plane. Since each edge contact of the test boards typically engages the back plane receptacle contacts with the significant compressive force conventional to provide secure electrical contact, the total force required to plug all the test boards into a back plane simultaneously, as a unit, is generally too large to allow ready interconnection by manual means. Further, the force is often so great that the panel of the back plane bends, becoming permanently deformed. Accordingly, a unit of printed circuit test boards generally is not plugged into a wired back plane, except in limited instances where only a relatively small number of electrical contacts are involved.

Alternative to plugging a unit of printed circuit test boards into a wired back plane simultaneously, which as indicated is generally not feasible, is to plug each test board into the back plane separately. However, this procedure is generally undesirable because it is excessively time consuming and subject to operator error.

A still further problem in the testing of wired printed circuit back planes is that the edge contacts on the test boards become sufficiently worn so as to be subject to defective connection after being plugged into and removed from a relatively small number of back planes.

Accordingly, it is an object of this invention to provide male connection apparatus for plugging printed circuit equipment into, and alternatively for removing it from, receptacle equipment with less force than is conventionally required.

Another object of the invention is to provide a printed circuit board that plugs into and out of card-edge receptacle equipment with less force than conventional apparatus.

A further object of the invention is to provide a method and apparatus for plugging a set of printed-circuit card-edge contacts into a printed circuit back plane simultaneously as a unit with significantly less force and less contact wear than is conventionally encountered.

It is also an object of the invention to provide a low-force, male, printed-circuit board edge connector.

Other objects of the invention will in part be obvious and will in part appear hereinafter.

SUMMARY OF INVENTION

In printed circuit connection equipment embodying the invention, the connection edge of the printed circuit board is thinner than standard. Hence it telescopically interfits with an edge receptacle with little or no interference and hence with little force. Also, there is little wear of the contacts of the circuit board or in the receptacle.

Wedge means are provided for separating the laminae of the printed circuit board to conventional thickness after interconnection of the board and receptacle, and alternatively for reducing the card thickness to the thin size prior to unplugging the card from the receptacle.

The invention preferably is practiced by forming the connection edge of a printed circuit board with two sheet members in register with each other and having a shim-like wedge member sandwiched between them. Further, each circuit board preferably includes means resiliently urging the sheet members together at the connection edge of the card.

The wedge member is retracted from the board edge so that the board thickness at the connection edge is sufficiently small to plug into and out of a receptacle with little or no interference, i.e. with essentially a clearance fit. However, movement of the wedge member toward the connection edge of the board wedges the sheet members apart to the desired conventional thickness that provides secure engagement between the electrical contacts on the board and those in the receptacle.

A printed circuit board according to the invention and for interconnecting test equipment successively with each of a number of identical receptacle devices, has edge contacts along two opposite edges and has a standard thickness at the edge that is plugged into the test equipment. However, the other edge of the test board, which is to be plugged into the equipment to be tested, is constructed with less than standard thickness but for wedging enlargement in the manner indicated above. Such a test board typically has two sheet members extending along the full length of the board between the two opposed contact edges, and has a spacer layer sandwiched between the sheet members at the card edge that is plugged into the test equipment. A wedge member is movable between the central portion of the board and the other contact edge to wedge the other contact edge apart for secure electrical connection with the receptacle being tested, and alternatively to allow the thickness to diminish for easy, low force insertion into and removal from the receptacle.

The invention accordingly comprises the features of construction, combinations of elements, and arrangement of parts exemplified in the constructions hereinafter set forth, and the several steps and the relation of one or more of such steps with respect to each of the others which the apparatus provides, all as exemplified in the following detailed disclosure, and the scope of the invention is indicated in the claims.

BRIEF DESCRIPTION OF DRAWINGS

For a fuller understanding of the nature and objects of the invention, reference should be had to the following detailed description, taken in connection with the accompanying drawings, in which.

DESCRIPTION OF ILLUSTRATED EMBODIMENTS

Figures 1, 2, 3:
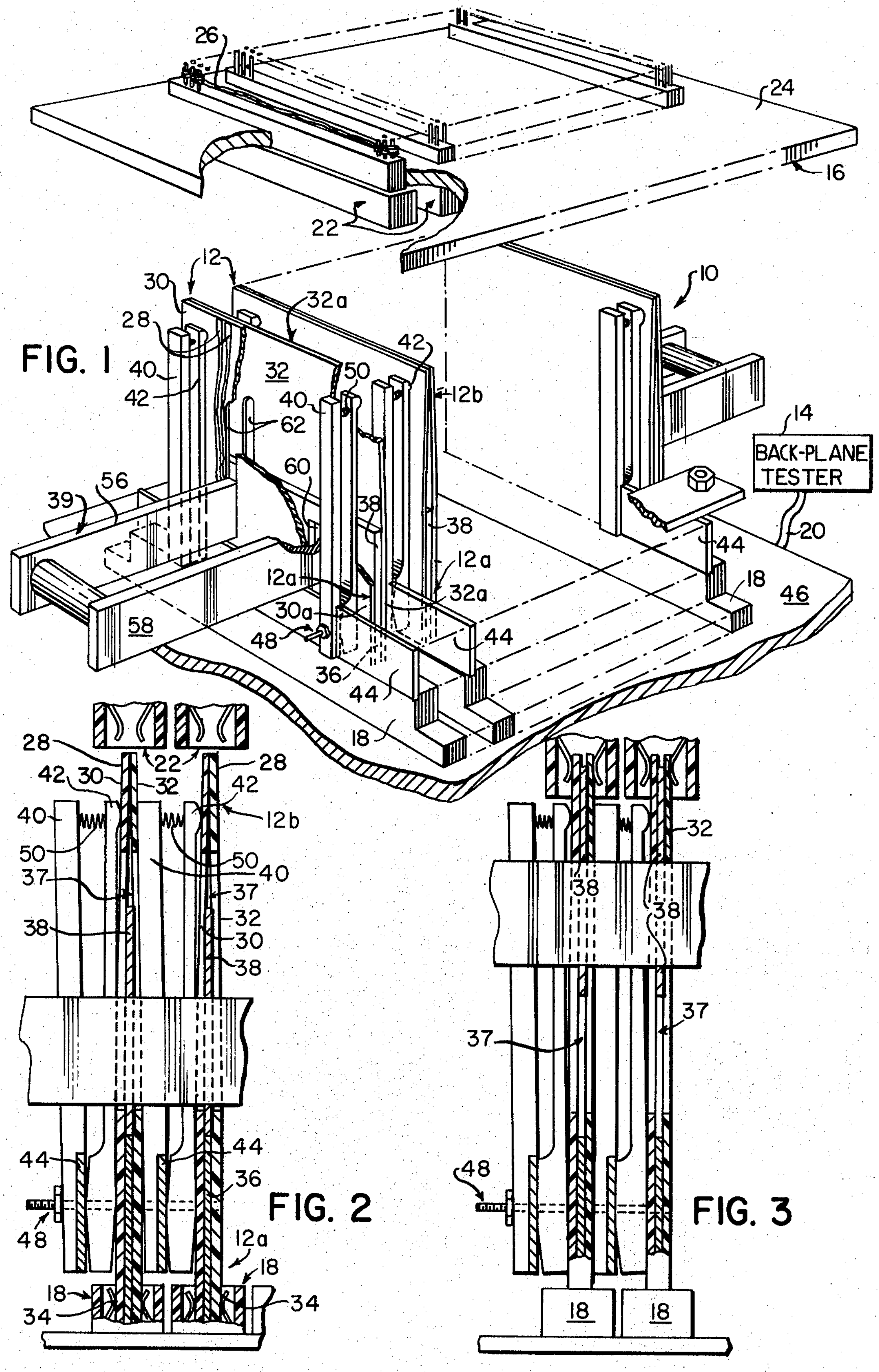
FIG. 1 is a perspective view, partly broken away, of low-force male printed circuit connection apparatus embodying the invention.
FIG. 2 is a fragmentary side elevation view, partly broken away, of the equipment of FIG. 1 showing the wedge member in the retracted position.
FIG. 3 is a view similar to FIG. 2 and showing the wedge member in the extended position.

FIG. 1 shows an assembly 10 of printed circuit boards 12, 12 for interconnecting a back plane tester 14 with a wired printed circuit back plane 16. The circuit board assembly 10 connects to the tester 14 by way of an array of connectors 18, 18 and a cable 20. The tester 14 is a conventional test system for wired back planes, such as the N131 test system available from Teradyne, Inc., Boston, Massachusetts. Further, the connectors 18 associated with the tester 14 are arrayed in a manner identical to the arrangement of connectors 22 on the back plane 16, and the circuit board assembly 10 serves as an interconnecting unit between the tester connectors 18 and the back plane connectors 22.

The illustrated back plane 16 has connectors 22, each of which has a printed circuit card-edge receptacle, on a mounting panel 24. Insulated conductors 26 interconnect wire-wrap pins on the connectors 22. The function of the tester 14 is to ensure that all the connections specified for the back plane 16 have in fact been made, and that each is free of an open circuit, as can result from a broken conductor 26, and is free of short circuits to another conductor, a wire-wrap pin, or the mounting panel 24.

The contact edge 12a of each board 12 of the assembly 10 plugs into the card-receiving receptacle of a connector 18 in a conventional manner with the edge contacts on the board electrically engaging socket contacts in the connector 18. This mounting and connection of the boards 12 with the connectors 18 is maintained fixed throughout the testing of all back planes 16 of the same type.

However, in accordance with the invention, edge contacts 28 on the other edge **12*b* of the assembled printed circuit boards 12 plug into the back panel connectors 22 with a force significantly lower than is conventional. This enables an operator to interconnect the back plane 16 to the test equipment easily and quickly. Further, the circuit boards 12, 12 are constructed, in the manner set forth hereinbelow, to wedge the edge contacts within the back plane connectors for sure electrical connection. After testing of the back plane, the circuit board edge contacts are released to enable the back plane 16 to be removed from the circuit board assembly 10** with the same low force and ease with which it was initially connected.

The printed circuit boards 12, 12 of the assembly 10 typically are of identical structure as now described with reference to FIGS. 1, 2 and 3. Two sheet members 30 and 32 in register with each other form the basic structure of each board 12. Each sheet member 30, 32 carries printed circuit wiring and electrical components, if any, on the outer side **30*a*, 32*a*, respectively, in a conventional manner. Each sheet member also carries, on this same side, edge contacts 28 along the board edge 12*b* that plugs into the back panel connectors 22, and edge contacts 34 along the board edge 12*a* that is plugged into the tester receptacles 18**.

The two sheet members of each board are preferably identical except for the electrical circuit elements, including conductors, which each carries. In particular, the two sheet members are preferably of the same thickness and have a combined total thickness significantly less than that of a conventional circuit board with which each receptacle 18 and 22 is designed to mate. By way of example, each sheet member can have a thickness of one-quarter that of the conventional circuit board standard for the receptacles 18 and 22; so that the total thickness of the two sheet members 30, 32 of each board is one-half that of the conventional board.

Each illustrated board has a flat spacer 36 between the sheet members 30 and 32 at the lower portion of the board that forms the contact edge **12*a*. This portion can be in the order of one-quarter of the board height between the edges 12*a* and 12*b*. The two sheet members and the spacer 36 of each board can be adhesively or otherwise bonded together to form a single unit. With the foregoing illustrative sheet member thickness of one-quarter that of the conventional circuit board, the spacer 36 would have a thickness of one-half the conventional board thickness so that the total thickness of the two sheet members and the spacer is exactly that of a conventional circuit board. With this construction, each board 12 plugs into a connector 18 in the conventional manner, as shown at the bottom of FIG. 2**.

Each printed circuit board 12 also has a shim-like wedge 38 sandwiched between the sheet members 30 and 32 thereof. The wedge preferably extends across the entire width of the board, as does the spacer 36, but as illustrated extends along the board height for only part of the height of the space 37 between the sheet members and not occupied by the spacer. The illustrated wedge is of the same thickness as the spacer 36, as is considered preferable. The wedge is movable within the space 37, by means of a wedge-moving handle 39, between a retracted position shown in FIGS. 1 and 2 and an extended position shown in FIG. 3.

In the extended position of FIG. 3, the wedge 38 is interposed between the sheet members 30 and 32 at the board edge 12b. In this position, the wedge spreads the sheet members apart to the full thickness conventional for a circuit board that mates with the back plane connector 22. In many instances, partial extension of the wedge 38 provides sufficient expansion of the sheet members to produce adequate electrical connection, at least for test purposes.

In the retracted position of the spacer, FIG. 2, on the other hand, the wedge is withdrawn from the contact edge **12*b* of the circuit board toward the spacer 36 and the other contact edge 12*a*. Accordingly, the sheet members 30 and 32 are free to collapse against each other so that the board edge 12*b* then has a total thickness significantly less than is conventional. In this collapsed or reduced-thickness position, the circuit board plugs into the receptacle of a connector 22 with essentially little or no interference between the receptacle contacts and the edge contacts on the board. Thus, the board plugs into the back plane connector with the very small force typical of a clearance fit. A resiliently-acting clamp, illustrated in FIGS. 1–3 as formed with clamping elements 40 and 42 and described in detail hereinbelow, urges the two sheet members of each board into the collapsed condition shown in FIG. 2** when the wedge is retracted.

With further reference to FIGS. 1, 2 and 3, the cards 12 are stacked in the assembly 10 alternated with spacers to space the cards according to the spacing of the back plane connectors 22. In the illustrated construction, these spacers include the base portions of clamp elements 40 and 42, and assembly hold-down bars 44. As illustrated in FIG. 1, alternate ones of the hold-down bars, which are optional, protrude from each side of the assembly 10, where they can be clamped to the panel 46 on which the receptacles 18 are mounted. The illustrated assemblage of the clamp elements, hold-down bars, and circuit boards 12 are clamped together with a pair of elongated threaded fasteners 48, 48 (FIG. 1).

Two pairs of clamp elements, each pair having a clamp element 40 and a clamp element 42, are interposed between each pair of adjacent cards 12 and, further, on each side of the assembly 10, as shown in FIG. 1. Each clamp element is a thin finger-like member elongated along the board height. Each pair of clamp elements 40, 42 forms a U-shape with the base of the U at the card lower portion where the spacer 36 is located and where the threaded fasteners 48, 48 extend through the assembly 10. The clamp elements extend upward, along the sides of the U-shape, to just below the board edge 12b that plugs into the connectors 22. A spring 50 is compressed between the elements 40, 42 of each pair to urge the upper ends of the paired elements apart. This action urges the two sheet members of each card 12 together, as shown in FIG. 2, with a resilient force. This in turn ensures that the two sheet members of each card maintain the desired small thickness when the wedge 38 is retracted, and hence can readily be plugged into the connectors 22 on a back plane 16.

Figure 4:
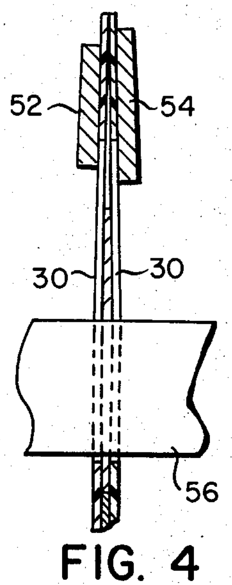
FIG. 4 is a side elevation view similar to FIG. 2 showing an alternative construction for urging the card-forming sheet members together.

Alternative to using clamp elements as shown in FIGS. 1, 2 and 3, other constructions can be used. For example, as shown in FIG. 4, a pair of magnetic elements 52 and 54 can be mounted on the card-forming sheet members 30 and 32, respectively, just below the board edge 12a to urge the two sheet members together due to the magnetic attraction between the two elements 52 and 54. Each magnetic element can be a permanent magnetic, alternatively one can be a permanent magnetic and the other a ferrous or like member that is attracted by the permanent magnet. Where the sheet member-clamping construction shown in FIG. 4 is used, separate spacers are provided between the circuit boards in the assembly 10, in lieu of the base portions of the clamp elements 40, 42, as desired.

The wedge-shifting handle 39 illustrated for the assembly of circuit boards 12 has two bars 56, 58 (FIG. 1) that pass through all the boards and wedges in the assembly. The two bars pass through the assembly at separate locations spaced apart along the width dimension of the boards. Each wedge 38 is apertured with two slots, such as the slot 60 shown in FIG. 1, through which the bars pass with minimal clearance in order that the wedges move with relative precision according to the movement of the bars. Each sheet member 30, 32 is apertured with two larger slots 62, 62 through which the bars 56, 58 pass with a clearance throughout the travel of the handle 39 between the retracted position shown in FIG. 2 and the extended position shown in FIG. 3.

Figure 5:
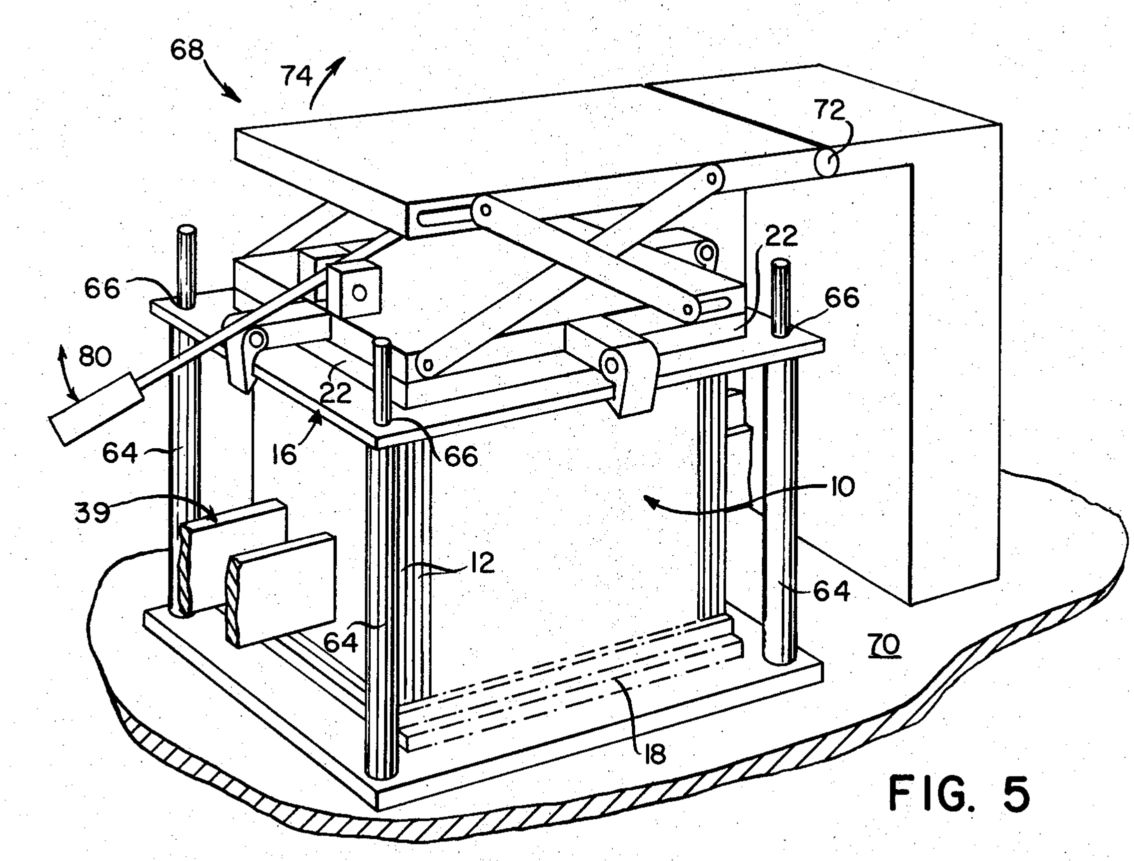
FIG. 5 is a perspective view of electrical connection equipment embodying the invention for use in testing printed circuit back planes and like structures.

FIG. 5 illustrates the simple construction made possible by virtue of the invention for loading the back plane 16 of FIG. 1 onto test equipment. Elements in FIG. 5 corresponding to elements described above with reference to FIGS. 1, 2 and 3 bear the same reference numeral as in the latter figures. The panel 46 on which the receptacles 18 are mounted has four aligning posts 64, 64 protruding upward to receive the back plane, which fits onto the aligning posts at four aligning holes 66, 66 through the back plane mounting panel 24. The illustrated test equipment mounts a scissor-type mechanism 68 for seating the back plane onto the assembly 10 of circuit boards, and alternatively for lifting it off the assembly after completion of the test, with a motion that maintains the back plane perpendicular to the circuit boards 12. The illustrated mechanism 68 is mounted to the tester base 70 by way of a hinge 72 so that it can swing upwardly, in the direction of arrow 74, to allow unhampered loading of the back plane onto the aligning posts 64, 64; after which the mechanism is swung down into place with the lower platen 76 thereof resting on the upstanding wire-wrap pins of the plane 16. The illustrated mechanism 68 also has lifting hooks, carried on the platen 76, which engage the underside of the panel 24 of the back plane.

With this arrangement, after an operator places the back plane onto the aligning posts and swings the lever mechanism 68 into the position shown, the operator simply lowers the mechanism-actuating lever handle 80 to move the platen 76 downwardly and thereby seat the back plane connectors onto the assembly of printed circuit boards. The wedge-shifting handle 39 is in the retracted position for this operation, so that each circuit board has the thin configuration shown in FIG. 2. Thereafter, the handle 39 is raised, thereby shifting the wedge to the extended position shown in FIG. 3 and expanding the circuit board contact edges **12*a* within the receptacles of the connectors 22. After the back plane is tested, the wedge-shifting handle 39 is lowered to retract the wedges, and the handle 80 of the lever mechanism is raised. This movement of the handle 80 raises the platen 76, together with the hook 78**, upward from the tester base, and thereby lifts the tested back plane 16 free of the circuit board assembly 10. The lever mechanism 68 can then be swung upward about the hinge 72 to allow the tested back plane to be removed from the tester and the next plane to be tested to be fed to the equipment.

It will thus be seen that the invention provides a male printed circuit board connection element that can be plugged into a card-edge receptacle with essentially a clearance fit and hence with essentially minimal force and contact wear. This enables a printed circuit board unit having a multitude of edge contacts, e.g. numbering at least in the hundreds to be plugged into mating receptacles simultaneously as a single unit and yet with such a low force that it can readily be done manually and without damage to any of the structure, such as a back plane receptacle-mounting panel. After being thusly engaged with electrical receptacles, the male connector element of the invention is wedged into the receptacles to provide the same secure electrical contact as is conventionally available between each receptacle contact and each circuit board edge contact. Conversely, the male connector element of the invention can be released to allow removal of the connector element from the receptacle structure with the same low force and hence ease, and low contact wear, with which the connector element was originally engaged with the receptacle structure.

The invention makes these features possible by providing a printed circuit board with an essentially split, two-ply laminar construction at the contact edge and which is significant thinner than a conventional circuit board. Clamping elements maintain the two laminae of each circuit board pressed together at the contact edge. A laminae-separating wedging member seated between the laminae of the circuit board is movable from a retracted position, where it is removed from the contact edge, to an extended position where it separates the board-forming laminae at the contact edge to provide the circuit board with the conventional or other thickness desired.

It should be noted that although the circuit boards 12 illustrated have edge contacts along two opposite edges, the invention is equally applicable to circuit boards having only a single set of edge contacts along the edge corresponding to the illustrated edge 12*b*. The other connections from such a circuit board can be directly to a cable or by means of other conventionally available connection structures.

It will thus be seen that the objects set forth above, among those made apparent from the preceding description, are efficiently attained. Since certain changes may be made in the above constructions and operating steps without departing from the scope of the invention, it is intended that all matter contained in the above description or shown in the accompanying drawings shall be interpreted as illustrative and not in a limiting sense. The following claims are intended to cover all of the generic and specific features of the invention described herein, and all statements of the scope of the invention which, as a matter of language might be said to fall therebetween.

Having described the invention, what is claimed as new and secured by Letters Patent is:

1. Printed circuit apparatus for facile removable and replaceable connection with an electrical receptacle device, said apparatus having printed circuit board means having first and second sides and carrying contacts on at least a first side thereof along a first board edge which is opposite a second board edge, and having the improvement comprising A. first and second sheet-like members in register with each other and forming respectively said first and second sides of said printed circuit board means along at least said first edge thereof, B. means holding said first and second sheet members in register with each other, and C. wedge means interposed between said sheet members for selectively separating them at said first edge, said wedge means being movable between a first position adjacent said first board edge and a second position removed from said first board edge in the direction toward said second board edge.

2. Apparatus according to claim 1 wherein

A. said first and second sheet members extend between said first and second board edges, B. at least one sheet member carries edge contacts along said second board edge, and C. a spacer is interposed between said sheet members along said second board edge, said spacer extending between said sheets for only part of the distance between said first and second board edges.

3. Apparatus according to claim 1 further comprising yieldable means urging said sheet members together at said first board edge.

4. Apparatus according to claim 1 wherein said wedge means includes wedge transport means protruding from said printed circuit board means and for moving said wedge means between said first and second positions thereof.

5. Printed circuit apparatus according to claim 1 for connection with a receptacle device having a board-edge receiving socket with a first width, and further characterized in that A. said first and second sheet members have a combined second thickness adjacent said first edge thereof less than said first width, and B. said wedge means has a thickness substantially equal to the difference between said first width and said second thickness.

6. A circuit board for repeated ready removal and insertion at a first edge spaced opposite a second edge into an edge-engaging electrical receptacle device, said board comprising A. first and second sheet members in register with each other and providing said circuit board with a first thickness at least at said first edge thereof, B. shim-like wedge means sandwiched between said sheet members and movable between a first position adjacent said first board edge to provide with said sheet members a second thickness of said board at least at said first edge thereof, and a second position removed from said first board edge in the direction toward said second board edge, and C. wedge-moving means extending outward beyond said circuit board and coupled to said wedge means for moving it between said first and second positions.

7. A circuit board according to claim 6 further comprising means urging said first and second sheet members together with resilient force adjacent said first board edge.

8. A circuit board according to claim 7 in which said resiliently-urging means comprises a permanent magnet element on one sheet member and a magnetic element in register therewith on the other sheet member.

9. A circuit board according to claim 7 in which said resiliently-urging means comprises first and second clamping elements mounted with said board on opposite sides of said sheet members and resiliently urged toward each other adjacent said first board edge.

10. A method for connecting an electrical circuit board with a receptacle device mountingly receiving a circuit-board edge, said method comprising the successive steps of A. forming a first connection edge of said circuit board with a pair of delaminated sheet members having a combined first thickness sufficiently small to be substantially freely received in said receptacle device, B. inserting said first connection edge of said circuit board into said receptacle device, and C. separating said sheet members at said first connection edge to second thickness greater than said first thickness and sufficiently large to engage said receptacle device securely.

11. A method according to claim 10 comprising the further step of urging said sheet members together adjacent said first connection edge during said inserting step.

* * * * *